(12) United States Patent
Shizuno

(10) Patent No.: US 7,569,419 B2
(45) Date of Patent: Aug. 4, 2009

(54) METHOD FOR MANUFACTURING SEMICONDUCTOR DEVICE THAT INCLUDES MOUNTING CHIP ON BOARD AND SEALING WITH TWO RESINS

(75) Inventor: Yoshinori Shizuno, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 146 days.

(21) Appl. No.: 11/857,216

(22) Filed: Sep. 18, 2007

(65) Prior Publication Data
US 2008/0081401 A1 Apr. 3, 2008

(30) Foreign Application Priority Data
Sep. 29, 2006 (JP) .............................. 2006-269209

(51) Int. Cl.
*H01L 21/56* (2006.01)
(52) U.S. Cl. ................. 438/108; 438/126; 257/E21.503
(58) Field of Classification Search .................. 438/126
See application file for complete search history.

(56) References Cited
U.S. PATENT DOCUMENTS 5,290,197 A * 3/1994 Ohnuma et al. ............... 445/24
6,373,142 B1 * 4/2002 Hoang ......................... 257/783
6,528,408 B2 * 3/2003 Kinsman ...................... 438/613
2002/0100969 A1 * 8/2002 Farquhar et al. ............. 257/717
2002/0185752 A1 * 12/2002 Ishikawa et al. ............. 257/788

FOREIGN PATENT DOCUMENTS

| JP | 2003-234362 | 8/2003 |
|---|---|---|
| JP | 2004-179576 | 6/2004 |
| JP | 2005-276879 | 10/2005 |
| JP | 2006-140327 | 6/2006 |

* cited by examiner

*Primary Examiner*—Stephen W Smoot
(74) *Attorney, Agent, or Firm*—Rabin & Berdo, P.C.

(57) ABSTRACT

The present invention provides a method for manufacturing a semiconductor device, which is capable of suppressing an overflow of a sealing resin and obtaining good sealing quality, simply and at low cost. Further, the present invention provides a semiconductor device that suppresses an overflow of a sealing resin and has good sealing quality, simply and at low cost. Liquid first underfill higher in viscosity than liquid second underfill is charged into space defined between a corresponding edge side of four edge sides of each of semiconductor chips, at which the distance between at least one edge side and each of pads opposite thereto, of an interposer is of the shortest, and the interposer. The liquid first underfill is cured and sealed with first underfill. Thereafter, the liquid second underfill is charged into space defined between the semiconductor chip and the interposer excluding the space sealed with the first underfill. The liquid second underfill is cured and sealed with second underfill.

21 Claims, 4 Drawing Sheets

METHOD FOR MANUFACTURING SEMICONDUCTOR DEVICE THAT INCLUDES MOUNTING CHIP ON BOARD AND SEALING WITH TWO RESINS

BACKGROUND OF THE INVENTION

The present invention relates to a semiconductor device packaged by mounting semiconductor chips over a mounting board, and a method for manufacturing the semiconductor device.

With greater functioning and miniaturization of small-sized electronic equipment typified by a cellular phone or the like, there has recently been an increasingly demand for a semiconductor device, a so-called SiP (System in Package) packaged by mounting a plurality of semiconductor chips and chip parts such as passive elements over a mounting board called an interposer in high density.

However, there is a need to make the mounting board as small in size as possible for the purpose of high-density packaging. A reduction in the difference between the outer shape of the mounted semiconductor chip and the outer shape of the mounting board is required.

The space between the mounting board and the semiconductor chip is normally sealed with a sealing resin called underfill. However, a problem arises in that when the difference between the outer shape of the semiconductor chip and the outer shape of the mounting board is made small, the sealing resin covers external terminals provided around a chip mounting area of the mounting board due to an overflow of the sealing resin, thereby causing a poor connection.

Although a reduction in its overflow can be improved by adaptation of a high-viscosity sealing resin, its filling needs a long period of time and voids and unfilling are easy to occur.

There has thus been proposed in a patent document 1 (Japanese Unexamined Patent Publication No. 2005-276879), an example in which a sealing resin low in viscosity and good in filling property is applied and a dam for damming the sealing resin is provided between a semiconductor chip and each external terminal over a mounting board such that the extruded sealing resin does not cover the external terminals provided around a chip mounting area of the mounting board.

However, the present situation is that the above proposal adopts a technique for applying the resin over the entire surface of the mounting board for dam formation and thereafter processing it into a predetermined shape in accordance with a photolitho process and cannot obtain satisfaction in terms of cost, manufacturing time and the like.

SUMMARY OF THE INVENTION

With the foregoing in view, it is therefore an object of the present invention to provide a method for manufacturing a semiconductor device, which is capable of suppressing an overflow of a sealing resin and obtaining good sealing quality, simply and at low cost. It is another object of the present invention to provide a semiconductor device which suppresses an overflow of a sealing resin and has good sealing quality, simply and at low cost.

According to a first aspect of the present invention, for attaining the above object, there is provided a method for manufacturing a semiconductor device, comprising a first step for preparing a mounting board having external terminals formed around a chip mounting area, a second step for preparing a semiconductor chip having a plurality of edge sides, a third step for mounting the semiconductor chip over the mounting board, a fourth step for charging a first sealing resin into at least part of a first space defined between each edge side, at which the distance from the corresponding edge side to each of the external terminals opposite to the edge side is the shortest, of the edge sides of the semiconductor chip, and the mounting board, a fifth step for curing the first sealing resin to seal the first space, a sixth step for charging a second sealing resin into the first space filled with the first sealing resin or a second space defined between the semiconductor chip and the mounting board, excluding the first space sealed with the first sealing resin, and a seventh step for curing the second sealing resin to seal the second space.

According to a second aspect of the present invention, there is provided a method wherein the viscosity of the first sealing resin is higher than that of the second sealing resin.

According to a third aspect of the present invention, there is provided a method wherein in the fourth step, the first sealing resin is charged into the first space in such a manner that at least one uncharged region is provided.

According to a fourth aspect of the present invention, there is provided a method wherein in the fourth step, the first sealing resin is charged into the first space after starting to heat the mounting board, and the curing of the first sealing resin by the fifth step is performed simultaneously with the charging thereof.

According to a fifth aspect of the present invention, there is provided a method wherein the curing of the first sealing resin by the fifth step and the curing of the second sealing resin by the seventh step are carried out simultaneously.

According to a sixth aspect of the present invention, there is provided a method wherein in the third step, the semiconductor chip is singular, and the semiconductor chip is mounted over the mounting board in such a manner that the center of the semiconductor chip and the center of the mounting board are shifted from each other.

According to a seventh aspect of the present invention, for attaining another object, there is provided a semiconductor device comprising a mounting board including a chip mounting area, an outer peripheral area that surrounds the chip mounting area, external terminals formed in the outer peripheral area, and wirings respectively connected to the external terminals formed over the chip mounting area and the outer peripheral area; a semiconductor chip having a plurality of edge sides and connected to the wirings and mounted over the mounting board; a first sealing resin that seals at least part of a first space defined between the corresponding edge side, at which the distance from the edge side to each of the external terminals opposite to the edge side is the shortest, of the edge sides of the semiconductor chip, and the mounting board; and a second sealing resin that seals a second space defined between the semiconductor chip and the mounting board excluding the first space sealed with the first sealing resin.

According to an eighth aspect of the present invention, there is provided a semiconductor device wherein the semiconductor chip is singular, and the semiconductor chip is mounted over the mounting board in such a manner that the center of the semiconductor chip and the center of the mounting board are shifted from each other.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
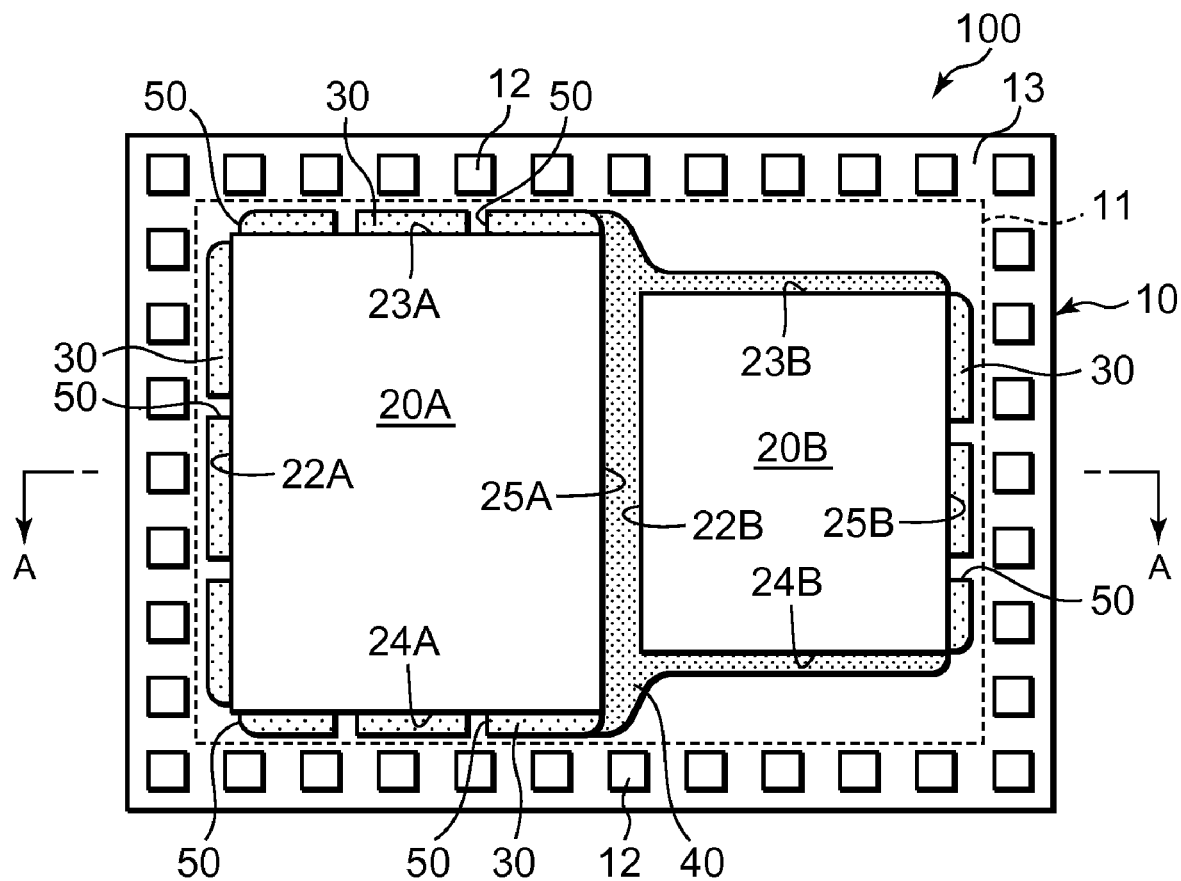
FIG. 1 is a schematic plan view showing a semiconductor device according to a first embodiment of the present invention.

Preferred embodiments of the present invention will hereinafter be described with reference to the accompanying drawings. Constituent elements having substantially similar functions will be explained with being given the same reference numerals through all the drawings. Their explanations might be omitted as the case may be.

First Preferred Embodiment

Figure 2:
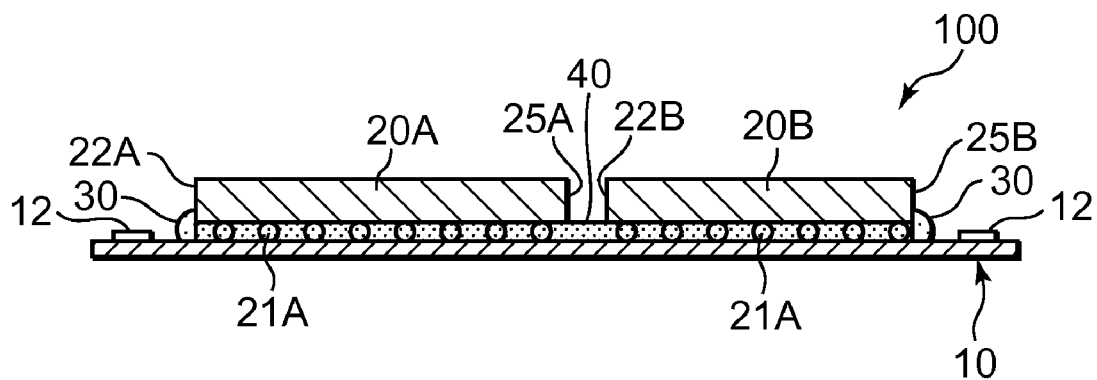
FIG. 2 is a schematic cross-sectional view illustrating the semiconductor device according to the first embodiment of the present invention.

FIG. 1 is a schematic plan view showing a semiconductor device according to a first embodiment of the present invention. FIG. 2 is a schematic cross-sectional view illustrating the semiconductor device according to the first embodiment. FIG. 2 is a cross-sectional view taken along line A-A of FIG. 1.

As shown in FIGS. 1 and 2, the semiconductor device 100 according to the present embodiment includes an interposer 10 (mounting board) having a chip mounting area 11, an outer peripheral area 13 that surrounds the chip mounting area 11, and pads 12 formed in the outer peripheral area 13 as external terminals at predetermined intervals, all of which are provided within a main surface. Wirings or the like respectively connected to the pads 12 used as the external terminals, which are formed over the chip mounting area 13 and the outer peripheral area 13, are also provided in the interposer 10.

For instance, a first semiconductor chip 20A (semiconductor chip) provided with bumps 21A over the single side as external terminals, and a second semiconductor chip 20B provided with bumps 21B over the single side as external terminals in like manner are mounted over the interposer 10 with being flip-chip connected to each other. Incidentally, although the second semiconductor chip 20B is smaller than the first semiconductor chip 20A and the first and second chips 20A and 20B different in size from each other are applied in the present embodiment, the present embodiment is not limited to it. Even at other than the semiconductor chips, passive elements (electronic components) such as capacitors, resistors, etc. may be mounted.

Space defined between each of edge sides 22A, 23A and 24A of the four edge sides 22A, 23A, 24A and 25A of the first semiconductor chip 20A, at which the distance from each of the edge sides to each of the pads 12 opposite to the edge sides, of the interposer 10, is the shortest, and the interposer 10 is sealed with first underfill 30. In the present embodiment, since the distances between the three edge sides 22A, 23A and 24A, excluding the edge side 25A opposite to the second semiconductor chip 20B, of the four edge sides, and their opposite pads 12 of the interposer 10 are approximately identical at the mounting position of the first semiconductor chip 20A, the space defined between each of the three edge sides 22A, 23A and 24A and the interposer 10 is sealed with the first underfill 30.

The space defined between the edge side 25B of the four edge sides 22B, 23B, 24B and 25B of the second semiconductor chip 20B, at which the distances between the corresponding edge side and the pads 12 opposite thereto, of the interposer 10 are the shortest, and the interposer 10 is sealed with the first underfill 30.

The first underfill 30 is provided with at least one unsealed portion 50. In the present embodiment, the first underfill provided between one edge side and the interposer 10 is provided with two unsealed portions, and an unsealed portion is provided even between the first underfills provided between the adjoining edge sides and the interposer 10.

Incidentally, the first underfill 30 may at least seal the space between the corresponding edge side of the four edge sides of the mounted semiconductor chip, at which the distance between the corresponding edge side and each of the pads opposite to the edge side, of the interposer is of the shortest, and the interposer. Alternatively, the first underfills 30 may seal the spaces between all edge sides excluding the edge side at which the distance between the corresponding edge side and each of the pads opposite to the edge side, of the interposer is the farthest, and the interposer. Liquid underfill to be described later is of course charged into the respective spaces in like manner.

Here, the distance between the edge side of the semiconductor chip and each of the pads (external terminals) of the interposer (mounting board) means the shortest distance between the edge side extending along the direction orthogonal to the edge side and its corresponding external terminal.

On the other hand, the space defined between the first semiconductor chip and the interposer 10 and the space defined between the second semiconductor chip 20B and the interposer 10 are sealed with second underfill 40 except for the spaces each sealed with the first underfill 30.

Thus, the semiconductor device 100 according to the present embodiment is packaged and can be mounted over another mounting board such as a motherboard or the like.

Te interposer 10 may be, for example, a metallic substrate typified by a silicon substrate, an aluminum substrate or the like, an organic resin substrate (including even a flexible printed board) typified by a glass substrate or a glass epoxy substrate, etc. In the present embodiment, the silicon substrate is applied as the interposer 10.

The pads 12 used as the external terminals, and wiring circuits (not shown) are formed in the interposer 10 using a plating method, a sputter method, a lithography method, etching and the like with respect to the substrate.

The first semiconductor chip 20A and the semiconductor chip 20B are respectively provided with the bumps 21A and 21B on their corresponding single sides and mountably configured while being electrically connected to the outside. However, the present embodiment is not limited to it but may be packaged as typified by, for example, a WCSP or an MCP.

Here, the WCSP (Wafer Level Chip Size Package or Wafer Level Chip Size Scale Package) is of a package having an outer size approximately equal to a chip size subjected to packaging processing on a wafer-by-wafer basis and obtained by fractionization. Such a WCSP has been disclosed in, for example, Japanese Unexamined Patent Publication No. Hei 9(1997)-64049. The MCP (Multi Chip Package) is of a package in which semiconductor chips are two-dimensionally or three-dimensionally mounted in plural form (on a stack structure basis).

As the first underfill 30 and the second underfill 40, may be mentioned, for example, an epoxy resin, a silicone resin, a phenol resin or the like. The first underfill 30 and the second underfill 40 may be identical or different in type. As will be described later, however, one higher in viscosity than the liquid second underfill is applied as the liquid first underfill.

A method for manufacturing the semiconductor device 100 according to the preset embodiment will be explained below. FIGS. 3 and 4 are process diagrams showing a process for manufacturing the semiconductor device according to the present embodiment, wherein FIG. 3 is a process diagram shown by a schematic plan view of the semiconductor device, and FIG. 4 is a process diagram shown by a schematic cross-sectional view of the semiconductor device.

An interposer 10, a first semiconductor chip 20A and a second semiconductor chip 20B are first prepared.

Figure 3A:
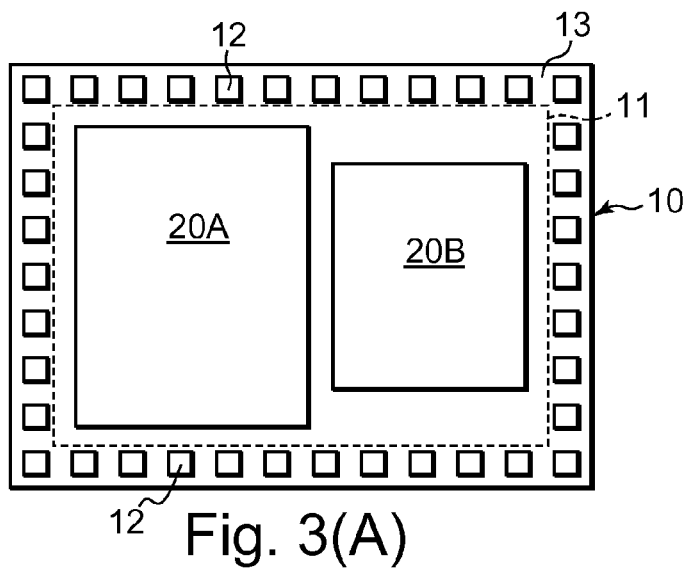
FIG. 3 is a process diagram showing a process for manufacturing the semiconductor device according to the first embodiment of the present invention.
Figure 4A:
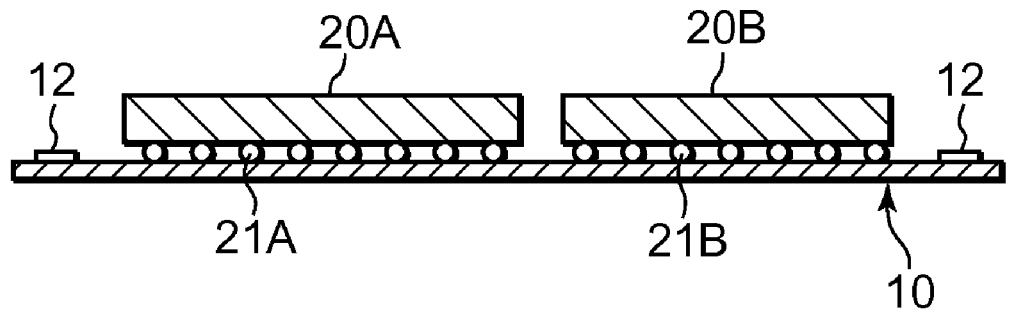
FIG. 4 is a process diagram illustrating the process for manufacturing the semiconductor device according to the first embodiment of the present invention.

Next, as shown in FIGS. 3(A) and 4(A), the first semiconductor chip 20A is mounted in a flip-chip connection over a chip mounting area 11 of the interposer 10 in such a manner that pads 12 used as external terminals thereof face the interposer 10.

Likewise, the second semiconductor chip 20B is also flip-chip connected onto and mounted over the chip mounting area 11 of the interposer 10 in such a manner than pads 12 used as external terminals thereof face the interposer 10.

Figure 3B:
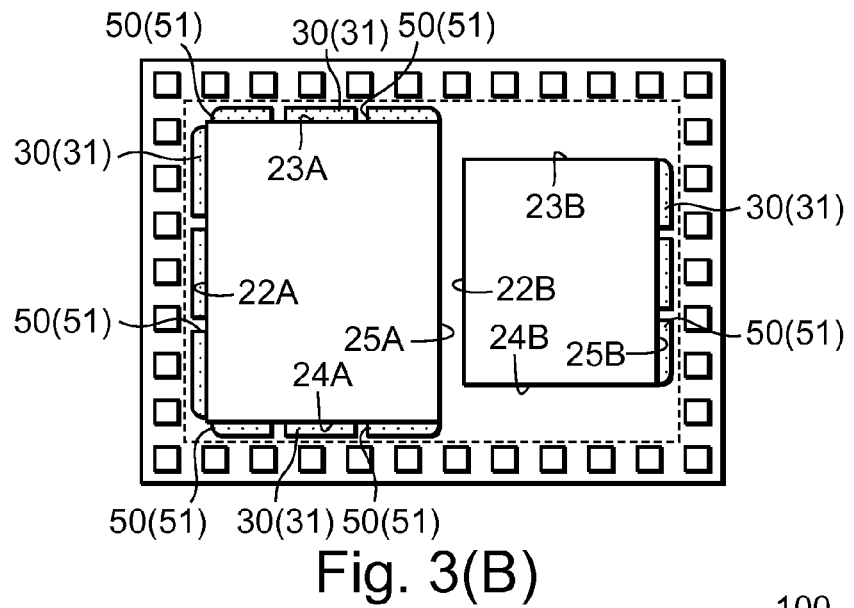
Figure 4B:
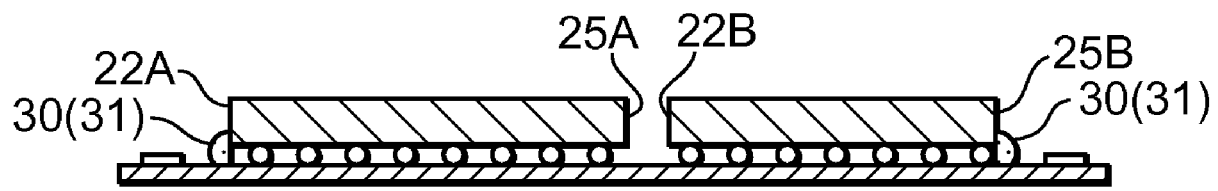

Next, as shown in FIGS. 3(B) and 4(B), liquid first underfill 31 is charged into spaces defined between three edge sides 22A, 23A and 24A of the four edge sides 22A, 23A, 24A and 25A of the first semiconductor chip 20A, at which the distances between the edge sides and the pads 12 opposite to the edge sides, of the interposer 10 are the shortest, and the interposer 10. This charge is carried out by, for example, a method for supplying the liquid first underfill through a needle or a method for spraying a given quantity of liquid first underfill at predetermined intervals.

Here, one higher in viscosity than liquid second underfill 41 to be described later is applied as the used liquid first underfill 31. Described specifically, for example, one having a viscosity (25° C.) of, for example, 40 to 100 Pa·s (preferably 50 to 70 Pa·s) and which holds the shape without spreading of the underfill over the surface of the substrate when charged, is applied as the liquid first underfill 31.

The liquid first underfill 31 is charged so as to have at least one uncharged portion 51 corresponding to each unsealed portion 50 of the post-curing first underfill 30. In the present embodiment, the liquid first underfill 31 is charged in such a manner that the two uncharged portions are provided for the liquid first underfill 31 charged between one edge side and the interposer 10, and the uncharged portion 51 is provided even between the liquid first underfill 31 charged between the adjoining edge sides and the interposer 10.

The filling of the liquid first underfill 31 is performed after heating of the interposer 10 to a temperature (ranging from 100° C. to 120° C.) at which the liquid first underfill 31 is cured is started. Thus, the charging of the liquid first underfill 31 and the curing of the liquid first underfill 31 (i.e., sealing by the first underfill 30) are carried out simultaneously.

After the charging of the liquid first underfill 31, the curing of the liquid first underfill 31 may be performed by heating the substrate or the like. Since, however, the liquid first underfill 31 is immediately cured in a state in which the fill shape of the liquid first underfill 31 is being maintained, by simultaneous execution of the charging of the liquid first underfill 31 and the curing of the liquid first underfill 31 (i.e., sealing by the first underfill 30), the unsealed portions 50 (uncharged portions 51) provided at the first underfill 30 may be formed small at arbitrary spots.

Figure 3C:
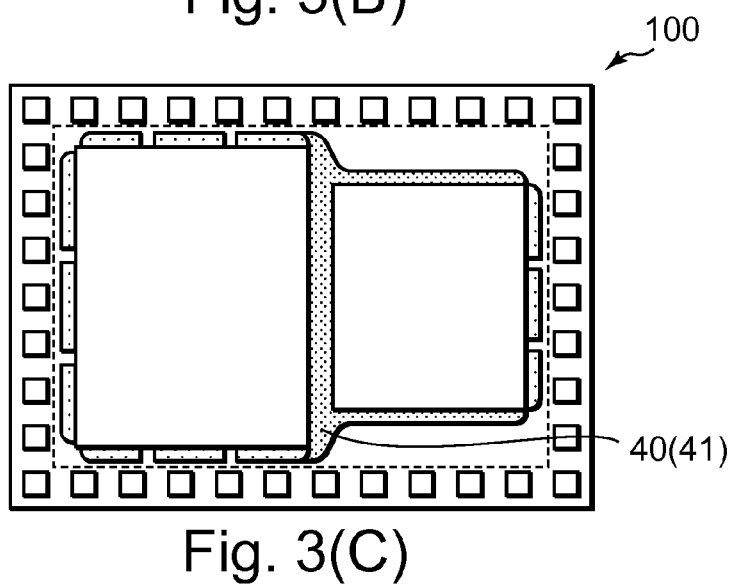
Figure 4C:
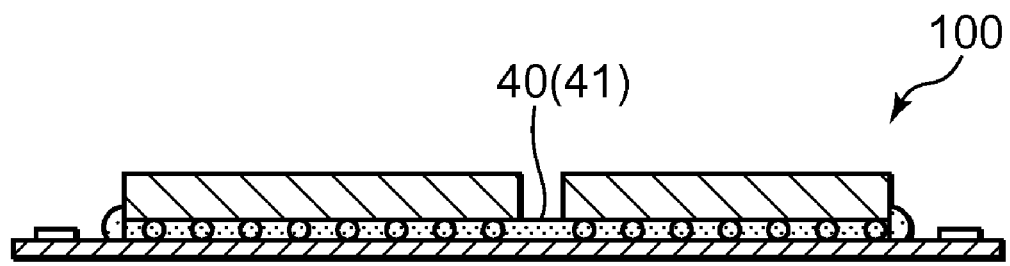

Next, as shown in FIGS. 3(C) and 4(C), liquid second underfill 41 is charged into space defined between the first semiconductor chip and the interposer 10 and space defined between the second semiconductor chip 20B and the interposer 10 except for space sealed with the first underfill 30 in a state in which the liquid second underfill is held over the interposer 10 at the normal working temperature (e.g., 25° C.). Then, the substrate or the like is heated to cure the liquid second underfill 41, which is followed by being sealed with second underfill 40.

Here, one lower in viscosity than the liquid first underfill 31 is applied as the liquid second underfill 41. Described specifically, for example, one which has a viscosity (25° C.) of, for example, 0.1 to 30 Pa·s (preferably 1 to 20 Pa·s) and which is excellent in fluidity and develops no void and unfilling, is applied as the liquid second underfill 41.

The semiconductor device 100 according to the present embodiment can be manufactured in this way.

In the semiconductor device 100 according to the present embodiment as described above, the liquid first underfill 31 is charged into the space between the corresponding edge side of the four edge sides of the mounted semiconductor chip, at which the distance between at least the edge side and each of the pads 12 opposite thereto, of the interposer 10 is of the shortest. Then, the charged liquid first underfill 31 is cured and sealed with the first underfill 30. Thereafter, the liquid second underfill 41 is charged into the space defined between the semiconductor chip and the interposer except for the space sealed with the first underfill 30. The liquid second underfill 41 is cured and sealed with the second underfill 40.

Upon charging of the liquid second underfill 41, the sealed first underfill 31 acts as a damming member (dam), so that an overflow of the second underfill 40 is suppressed and the second underfill 40 does not lie over the pads 12 of the interposer 10. Further, the first underfill can be formed by the operation of filling/curing or the like alone in a manner similar to the second underfill 40. Since no damming member is required, the distance between each of the edge sides of the semiconductor chip and each external terminal can also be shortened.

Using the liquid first underfill 31 higher in viscosity than the liquid second underfill 41 avoids spreading to the interposer 10 upon filling and makes it hard to apply the liquid first underfill 31 onto the pads 12 of the interposer 10. Further, since the liquid first underfill 31 is high in viscosity, it is easy to maintain the fill shape of the liquid first underfill 31 and form the unsealed portions 50 (uncharged portions 51) provided in the first underfill 30 at arbitrary spots and small.

Therefore, it is possible to suppress overflowing of the underfill (sealing resin) and realize good sealing quality, simply and a low cost.

In addition to the above, the uncharged portions 51 are provided upon charging of the liquid first underfill 31 and the unsealed portions 50 are provided in the first underfill 30 obtained by curing it. Therefore, the unsealed portions 50 function as air-bleeding holes, and the liquid second underfill 41 is charged without having the first underfill 30 and the spaces (uncharged portions), thereby making it possible to realize better sealing quality.

Incidentally, although the above embodiment has described the form in which the two semiconductor chips 20A and 20B are mounted, the present embodiment is not limited to it. A form in which a singular semiconductor chip or plural semiconductor chips more than the three are mounted may be adopted.

Figure 5:
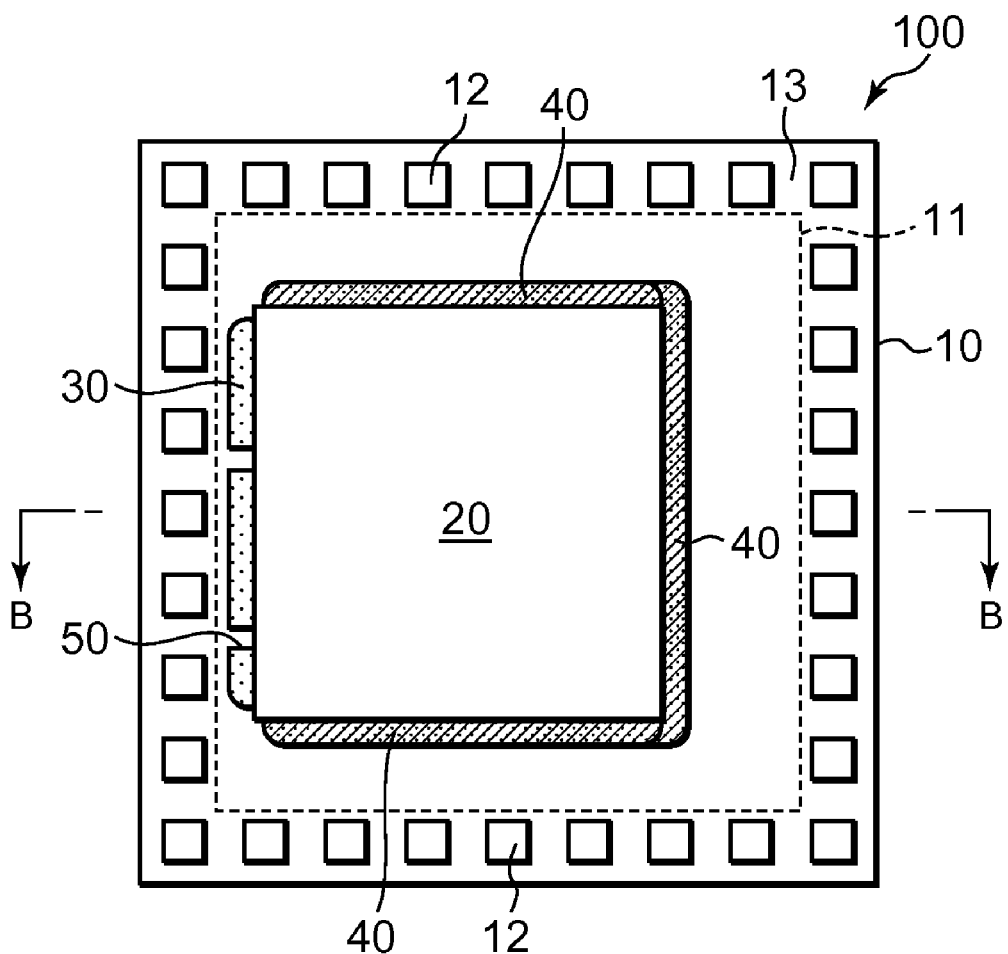
FIG. 5 is a schematic plan view showing a semiconductor device according to a second embodiment of the present invention.
Figure 6:
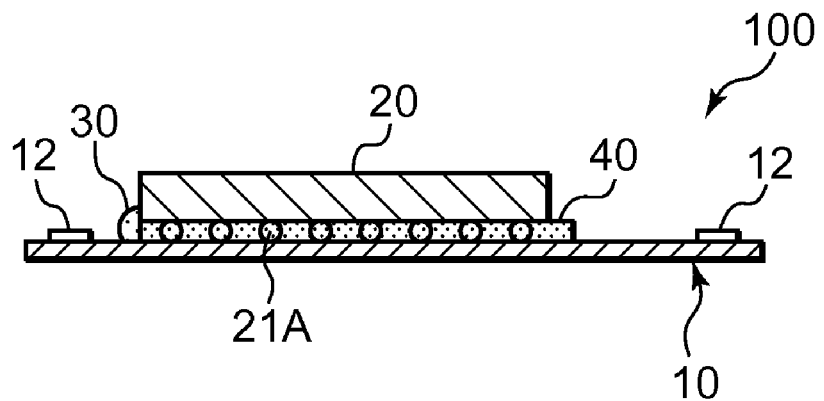
FIG. 6 is a schematic cross-sectional view illustrating the semiconductor device according to the second embodiment of the present invention.

When only the singular semiconductor chip is mounted here, the semiconductor chip 20 may preferably be mounted over an interposer 10 in such a manner that as shown in FIGS. 5 and 6, the center of the semiconductor chip 20 and the center of the interposer 10 are shift from each other, i.e., the semiconductor chip 20 is eccentrically-located over a chip mounting area lying on the interposer 10. Thus, the distance between at least one edge side of four edge sides of the semiconductor chip 20 and each of pads 12 opposite to the one edge side, which are used as external terminals of the interposer 10, is made shorter as compared with other edge sides. Described specifically, the distance between at least one edge side and each of the pads 12 opposite to the one edge side, which are used as the external terminals of the interposer 10, is made farther as compared with other edge sides, and thereby the filling position of liquid second underfill 41 is ensured.

In a manner similar to the present embodiment, liquid first underfill higher in viscosity than liquid second underfill is charged into space defined between each edge side at which the distance from at least one edge side to each of pads opposite thereto, of the interposer is of the shortest, and the interposer. Then, the liquid first underfill is cured and sealed with first underfill 30. Thereafter, the liquid second underfill is charged into space defined between the semiconductor chip and the interposer except for the space sealed with the first underfill 30. The charged second underfill is cured and sealed with second underfill 40. Thus, even in the case of such a form that the singular semiconductor chip is mounted, it is possible to suppress an overflow of underfill (sealing resin) and realize good sealing quality, simply and at low cost.

Second Preferred Embodiment

Incidentally, FIG. 5 is a schematic plan view showing a semiconductor device according to a second embodiment. FIG. 6 is a schematic cross-sectional view showing the semiconductor device according to the second embodiment. FIG. 6 is a cross-sectional view taken along line B-B of FIG. 5.

The present embodiment has explained the form in which the two semiconductor chips 20A and 20B are both provided with the first underfill 30 (or liquid first underfill 31). However, in the case of such a form in which a plurality of semiconductor chips are mounted, for example, semiconductor chips selected out of the plurality of semiconductor chips, at which the distances between all edge sides thereof and pads 12 of an interposer 10 increase sufficiently, need not to be provided with the first underfill 30.

Although the present embodiment has explained the form in which the charging and curing of the liquid first underfill 31 have been carried out simultaneously, such a form that the liquid first underfill 31 is cured after its filling may be adopted. Such a form that after the charging of the liquid first underfill 31, the liquid second underfill 41 is charged and thereafter the liquid first underfill 31 and the liquid second underfill 41 are cured simultaneously, may be taken. This form makes it possible to reduce the number of process steps as compared with the above-described embodiment. Since the charged liquid first underfill 31 sufficiently maintains a fill shape because of high viscosity in this form, it functions as a damming member at the filling.

Although the present embodiment has explained the form in which the underfill higher in viscosity than the liquid second underfill 41 is used as the liquid first underfill 31, the present invention is not limited to it. If the curing temperature of the liquid first underfill 31 is controlled, then one having viscosity nearly equal to the viscosity of the second underfill 41 and low viscosity not greater than it can be used. According to the present invention, there are provided the following semiconductor device:

1) A semiconductor device comprising:
   a mounting board including,
      a chip mounting area;
      an outer peripheral area that surrounds the chip mounting area;
      external terminals formed in the outer peripheral area; and
      wirings respectively connected to the external terminals formed over the chip mounting area and the outer peripheral area;
   a semiconductor chip having a plurality of edge sides and connected to the wirings and mounted over the mounting board;
   a first sealing resin that seals at least part of a first space defined between the corresponding edge side, at which a distance from the edge side to each of the external terminals opposite to the edge side is the shortest, of the edge sides of the semiconductor chip, and the mounting board; and
   a second sealing resin that seals a second space defined between the semiconductor chip and the mounting board excluding the first space sealed with the first sealing resin.

2) The semiconductor device according to claim 1), wherein the semiconductor chip is singular, and the semiconductor chip is mounted over the mounting board in such a manner that the center of the semiconductor chip and the center of the mounting board are shifted from each other.

The above embodiment is not construed in a limited way. It is needless to say that it can be implemented within the scope that satisfies the requirements of the present invention.

What is claimed is:

1. A method for manufacturing a semiconductor device, comprising:
   a first step for preparing a mounting board having external terminals formed around a chip mounting area;
   a second step for preparing a semiconductor chip having a plurality of edge sides;
   a third step for mounting the semiconductor chip over the mounting board;
   a fourth step for charging a first sealing resin into at least part of a first space defined between said each edge side, at which a distance from the corresponding edge side to each of the external terminals opposite to the edge side is the shortest, of the edge sides of the semiconductor chip, and the mounting board;
   a fifth step for curing the first sealing resin to seal the first space;
   a sixth step for charging a second sealing resin into the first space filled with the first sealing resin or a second space defined between the semiconductor chip and the mounting board, excluding the first space sealed with the first sealing resin; and
   a seventh step for curing the second sealing resin to seal the second space.

2. The method according to claim 1, wherein the viscosity of the first sealing resin is higher than that of the second sealing resin.

3. The method according to claim 2, wherein in the fourth step, the first sealing resin is charged into the first space in such a manner that at least one uncharged region is provided.

4. The method according to claim 3, wherein in the fourth step, the first sealing resin is charged into the first space after starting to heat the mounting board, and the curing of the first sealing resin by the fifth step is performed simultaneously with the charging thereof.

5. The method according to claim 4, wherein in the third step, the semiconductor chip is singular, and the semiconductor chip is mounted over the mounting board in such a manner that the center of the semiconductor chip and the center of the mounting board are shifted from each other.

6. The method according to claim 3, wherein the curing of the first sealing resin by the fifth step and the curing of the second sealing resin by the seventh step are carried out simultaneously.

7. The method according to claim 3, wherein in the third step, the semiconductor chip is singular, and the semiconductor chip is mounted over the mounting board in such a manner that the center of the semiconductor chip and the center of the mounting board are shifted from each other.

8. The method according to claim 2, wherein in the fourth step, the first sealing resin is charged into the first space after starting to heat the mounting board, and the curing of the first sealing resin by the fifth step is performed simultaneously with the charging thereof.

9. The method according to claim 8, wherein in the third step, the semiconductor chip is singular, and the semiconductor chip is mounted over the mounting board in such a manner that the center of the semiconductor chip and the center of the mounting board are shifted from each other.

10. The method according to claim 2, wherein the curing of the first sealing resin by the fifth step and the curing of the second sealing resin by the seventh step are carried out simultaneously.

11. The method according to claim 2, wherein in the third step, the semiconductor chip is singular, and the semiconductor chip is mounted over the mounting board in such a manner that the center of the semiconductor chip and the center of the mounting board are shifted from each other.

12. The method according to claim 1, wherein in the fourth step, the first sealing resin is charged into the first space in such a manner that at least one uncharged region is provided.

13. The method according to claim 12, wherein in the fourth step, the first sealing resin is charged into the first space after starting to heat the mounting board, and the curing of the first sealing resin by the fifth step is performed simultaneously with the charging thereof.

14. The method according to claim 13, wherein in the third step, the semiconductor chip is singular, and the semiconductor chip is mounted over the mounting board in such a manner that the center of the semiconductor chip and the center of the mounting board are shifted from each other.

15. The method according to claim 12, wherein the curing of the first sealing resin by the fifth step and the curing of the second sealing resin by the seventh step are carried out simultaneously.

16. The method according to claim 12, wherein in the third step, the semiconductor chip is singular, and the semiconductor chip is mounted over the mounting board in such a manner that the center of the semiconductor chip and the center of the mounting board are shifted from each other.

17. The method according to claim 1, wherein in the fourth step, the first sealing resin is charged into the first space after starting to heat the mounting board, and the curing of the first sealing resin by the fifth step is performed simultaneously with the charging thereof.

18. The method according to claim 17, wherein in the third step, the semiconductor chip is singular, and the semiconductor chip is mounted over the mounting board in such a manner that the center of the semiconductor chip and the center of the mounting board are shifted from each other.

19. The method according to claim 1, wherein the curing of the first sealing resin by the fifth step and the curing of the second sealing resin by the seventh step are carried out simultaneously.

20. The method according to claim 19, wherein in the third step, the semiconductor chip is singular, and the semiconductor chip is mounted over the mounting board in such a manner that the center of the semiconductor chip and the center of the mounting board are shifted from each other.

21. The method according to claim 1, wherein in the third step, the semiconductor chip is singular, and the semiconductor chip is mounted over the mounting board in such a manner that the center of the semiconductor chip and the center of the mounting board are shifted from each other.

* * * * *